(12) United States Patent
Polanyi et al.

(10) Patent No.: US 6,878,417 B2
(45) Date of Patent: *Apr. 12, 2005

(54) METHOD OF MOLECULAR-SCALE PATTERN IMPRINTING AT SURFACES

(75) Inventors: John C. Polanyi, 86 Willcocks Street, Toronto Ontario (CA), M5S 1C8; Duncan Rogers, 3801 W. Spring Creek Pkwy., Plano, TX (US) 75023

(73) Assignees: John C. Polanyi, Tornoto (CA); Duncan Rogers, Ibaraki (JP)

( * ) Notice: Subject to any disclaimer, the term of this patent is extended or adjusted under 35 U.S.C. 154(b) by 50 days.

This patent is subject to a terminal disclaimer.

(21) Appl. No.: 10/276,828

(22) PCT Filed: May 18, 2001

(86) PCT No.: PCT/CA01/00695

§ 371 (c)(1),
(2), (4) Date: Apr. 8, 2003

(87) PCT Pub. No.: WO01/88960

PCT Pub. Date: Nov. 22, 2001

(65) Prior Publication Data

US 2003/0157733 A1 Aug. 21, 2003

Related U.S. Application Data

(63) Continuation-in-part of application No. 09/573,683, filed on May 19, 2000, now Pat. No. 6,319,566, which is a continuation-in-part of application No. 08/967,891, filed on Nov. 12, 1997, now Pat. No. 6,156,393.

(51) Int. Cl.[7] .......................... B05D 3/06; H01L 21/263; H01L 21/3215
(52) U.S. Cl. ...................... 427/533; 427/552; 427/510; 427/497; 438/515; 438/694; 438/766; 438/795

(58) Field of Search .................... 427/510, 511, 427/515, 497, 498, 503, 504, 526, 527, 533, 576, 581, 596, 597, 595; 216/2.12, 65, 66, 94; 438/514–536, 694, 710, 712, 766, 765, 767, 769, 795, 796, 798

(56) References Cited

U.S. PATENT DOCUMENTS 4,340,617 A * 7/1982 Deutsch et al. ............. 427/581

(Continued)

FOREIGN PATENT DOCUMENTS

DE          3725169          2/1989

OTHER PUBLICATIONS

Placement of conjugated oligomers in an alkanethiol matrix by scanned probe microscopy lithography; Chen et al.; Applied Physics Letters, vol. 75, No. 5; Aug. 2, 1999 pps 624–626.

(Continued)

*Primary Examiner*—Marianne Padgett
(74) *Attorney, Agent, or Firm*—Lynn C. Schumacher; Hill & Schumacher

(57) ABSTRACT

A method for mask-free molecular or atomic patterning of surfaces of reactive solids is disclosed. Molecules adsorb at surfaces in patterns, governed by the structure of the surface, the chemical nature of the adsorbate, and the adsorbate coverage at the surface. The surface is patterned and then imprinted with the pattern by inducing localized chemical reaction between adsorbate molecules and the surface of the solid, resulting in an imprint being formed in the vicinity of the adsorbate molecules. When the imprinted molecular patterns are conjugated chains containing $\pi$ bonds along which electrical charge can flow the molecular patterns constitute molecular wires or the imprinted molecules constitute a molecular-scale device. The surface of the substrate can be doped by including n- or p-type dopants in the adsorbate molecules. These molecular wires are anchored to the substrate by using conjugated chains which can be 'chemically bound at intervals along the chains to the substrates.

18 Claims, 4 Drawing Sheets

← Clean

-1V

Picture at top left is an STM image of Si(111) 7x7, using -1V tip-voltage.

U.S. PATENT DOCUMENTS

| | | | | |
|---|---|---|---|---|
| 4,566,937 A | * | 1/1986 | Pitts | 216/13 |
| 4,608,117 A | | 8/1986 | Ehrlich et al. | |
| 4,615,904 A | | 10/1986 | Ehrlich et al. | |
| 4,701,347 A | | 10/1987 | Higashi | |
| 5,035,782 A | * | 7/1991 | Tamura et al. | 427/504 |
| 5,112,434 A | * | 5/1992 | Goldberg | 427/581 |
| 5,273,788 A | * | 12/1993 | Yu | 427/581 |
| 5,279,867 A | * | 1/1994 | Friedt et al. | 427/581 |
| 5,322,988 A | | 6/1994 | Russell et al. | |
| 5,393,699 A | * | 2/1995 | Mikoshiba et al. | 427/576 |
| 5,405,481 A | | 4/1995 | Licoppe et al. | |
| 5,492,734 A | * | 2/1996 | Matsumoto et al. | 427/576 |
| 5,512,328 A | * | 4/1996 | Yoshimura et al. | 427/503 |
| 5,645,897 A | | 7/1997 | Andra | |
| 5,935,454 A | * | 8/1999 | Tada et al. | 427/552 |
| 6,007,969 A | * | 12/1999 | Hatakeyama et al. | 427/552 |
| 6,432,317 B1 | * | 8/2002 | Douglas et al. | 216/62 |
| 6,517,401 B1 | * | 2/2003 | Ogawa et al. | 427/553 |
| 6,630,404 B1 | * | 10/2003 | Babcock | 438/694 |
| 6,737,286 B1 | * | 5/2004 | Tao et al. | 438/694 |
| 2004/0023519 A1 | * | 2/2004 | Clark et al. | 438/795 |

OTHER PUBLICATIONS

Selective nanoscale growth of titanium on the Si(001) surface using an atomic hydrogen resist; Mitsui et al.; Journal of Applied Physics; vol. 86, No. 3; Aug. 1, 1999, pps 1676–1679.

Organo–germanium adsorption on a silicon surface by excimer–light irradiation; Ohshima; Applied Surface Science 107 (1996) 85–89, no month.

The adsorption of $C_6H_5Cl$ on Si(111)7×7 studies by STM; Chen et al.; Surface Science 340 (1995) p. 224–230, no month.

"Laser–induced microscopic etching of GaAs and InP," D. J. Ehrlich, R. M. Osgood, Jr., and T.F. Deutsch, 1980 American Institute of Physics; Appl. Phys. Lett 36(8), Apr. 15, 1980 pps.698–700.

"Conversion of SiCl Pair and Island Sites to SiCl Single Site upon Annealing of Ci/Si(111)–7×7 Surfaces", Chun Yan, John A. Jensen and Andrew C. Kummel, 1995 American Chemical Society, J. Phys. Chem. vol. 99, No. 16, 1995, pps. 6084–6090, no month.

Anonymous, "Fabrication of Gold Nanostructures by Lithography with Self–Assembled Monolayers", *IBM Technical Disclosure Bulletin*, vol. 39, No. 12, Dec. 1996, pp. 235–238, NY.

M. Balooch and W.J. Siekhaus, "Spontaneous and STM–Induced Reaction of XeF2 with Si(111)–7×7 at Low Coverage", *Nanotechnology* 7, 1996, no month pp. 356–359, IOP Publishing Ltd., UK.

Chen X. H. et al., "Photoetching of Si(111)–(7×7) Studied by STM", *Surface Science*, Apr. 10, 1997, Elsevier, Netherlands, vol. 376, No. 1–3, pp. 77–86.

Chen X. H. et al., "Adsorption of $C_6H_5Cl$ on Si(111) 7×7 Studied by STM", *Surface Science*, Oct. 20, 1995, Elsevier Netherlands, vol. 340, No. 3, pp. 224–230.

* cited by examiner

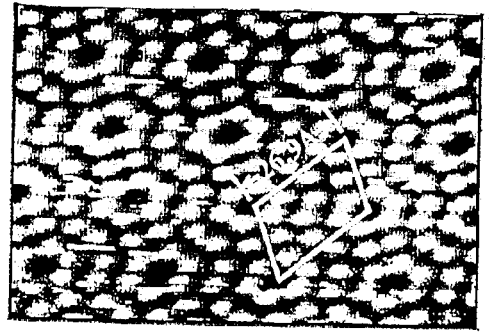
FIG. 1(a) ← Clean
-1V
Picture at top left is an STM image of Si(111) 7x7, using -1V tip-voltage.
FIG. 1(b)
1L ClBz →
-1.9V
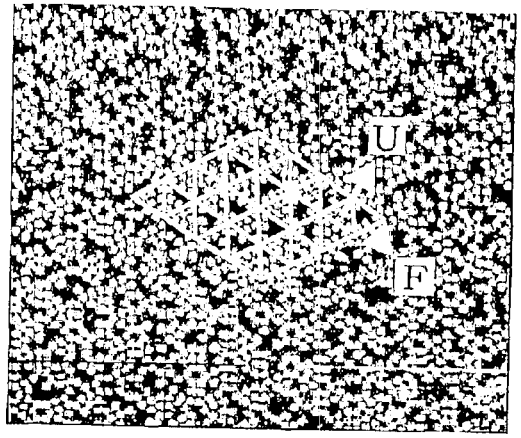
FIG. 1(c)
Chlorinated
 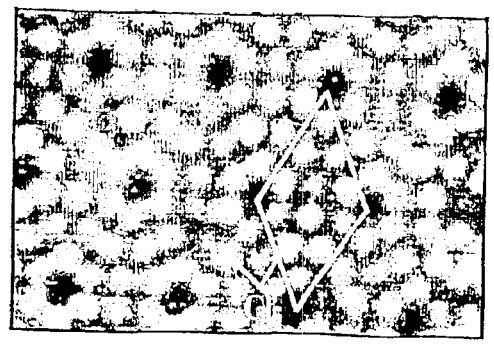
-1V  -3V
Increase in negative tip-bias causes Cl atoms to "light up", at right.

METHOD OF MOLECULAR-SCALE PATTERN IMPRINTING AT SURFACES

CROSS REFERENCE TO RELATED PATENT APPLICATION

This patent application is a continuation-in-part patent application of U.S. patent application Ser. No. 09/573,683 filed on May 19, 2000 entitled METHOD OF MOLECULAR-SCALE PATTERN IMPRINTING AT SURFACES, which and which is incorporated herein by reference in its entirety.

FIELD OF THE INVENTION

The present invention relates to a method for pattern imprinting, on an atomic or molecular-scale, of the surface of a solid by inducing localized chemical reaction between adsorbate molecules and the surface of the solid.

BACKGROUND OF THE INVENTION

Progress in the hundred billion dollar semi-conductor industry depends, in part, on the ability to mark (i.e. write, dope or etch) a surface with small features at controlled separations. The current limit is the making of marks separated by a few tenths of a nanometer (commonly 0.3 microns, i.e. 3,000 Å, which is roughly one thousand atoms separation). Patterns of these dimensions constitute the lower limit of what can be achieved by the conventional method of marking, which involves the use of a patterned mask to shield portions of the surface from the agent (electrons, light or chemicals) used in order to mark the surface. It has not proved possible to make patterned masks having features smaller than tenths of a micron. Moreover, masks with such small features already suffer from irreproducibility.

U.S. Pat. No. 5,645,897 issued to Andra discloses a method for surface modification by ion bombardment of the surface or the region in front of the surface portion being etched or coated. The ion source is chosen to produce ions which are highly charged and possessing kinetic energies sufficiently high to permit the ions to approach the surface but low enough to prevent penetration of the surface. A stated advantage of the process of this patent is that the highly charged state of the ions and their low kinetic energies results in very localized energy deposition thereby giving rise to improved spatial resolution in the imprinting of patterned masks for etching or coating the surface. This patent also discloses combining the feature of localized energy deposition using the ion beams with conventional lithographic masking techniques for producing precise etching patterns.

U.S. Pat. No. 5,405,481 issued to Licoppe et al. is directed to a gas photonanograph device for production of nanometer scale surface patterns. The device includes a head comprising a fiber optic cable terminating in a tip and microcapillary channels also terminating at the tip that feed reactive gas from a gas reservoir. The tip is spaced from the area of the substrate surface being light activated. Nanopatterns can be produced by scanning this device, as one might write with a pen, the tip of the pen here being a focused light source.

U.S. Pat. No. 4,701,347 issued to Higashi specifically mentions the photolysis of molecules adsorbed on a surface as a method for growing patterned metal layers on semiconductor. However, in common with earlier patents cited therein, going back to U.S. Pat. No. 3,271,180 issued on Sep. 6, 1966, the pattern of photolytic and thermal reaction induced by illumination of the adsorbate derives from the presence of a mask between the light source and the adsorbed layer.

U.S. Pat. No. 5,322,988, in common with U.S. Pat. No. 4,701,347 referred to above, uses laser irradiation to induce photochemical and thermal reaction between an adsorbate layer and the underlying substrate, but the reaction etches rather than writes (the etching is termed "texturing"). Reaction, it is stated, only occurs where the laser is impinging with sufficient fluence, i.e. patterned illumination (as beneath a "mask") is the source of patterned etching.

D. J. Ehrlich et al. in Appl. Phys. Lett. 36, 698 (1980) describe a method of mask-free etching of semiconductors based on the ultraviolet photolysis of gaseous methyl halides. The place of the patterned mask is taken by an interference pattern, i.e. it derives, once more, from patterned irradiation of the surface.

U.S. Pat. Nos. 4,608,117 and 4,615,904 issued to Ehrlich et al., disclose maskless growth of patterned films. This method describes a two-step process. In step one a pattern is written on the surface using a focused light-beam or electron-beam as a pen, and photodissociation as the agent for writing. Once a 1–2 monolayer pattern of metal or semiconductor has been written in this fashion, step two involves uniform irradiation of the gaseous reagent and the surface which results in the accumulation of material on the "prenucleated sites", i.e. in the close vicinity of the pattern of deposition formed in step one. Consequently this second growth-phase is mask-free. In the mask-free film-growth phase "atoms are provided dominantly by direct photodissociation of the gas-phase organometallic molecules." (U.S. Pat. No. 4,608,117, column 2, lines 12 and 13). Film growth, it is stated, occurs selectively in the prenucleated regions where impinging atoms originating in the gas phase have a higher sticking coefficient at the surface.

M. Balooch and W. J. Siekhaus, Nanotechnology, 7, (1996) 365–359, report on the adsorption of $XeF_2$ on a Si surface. They teach how to produce a silicon vacancy by bringing the tip of the STM down to the surface and then applying a voltage pulse between the STM tip and the surface. An etching reaction occurs at the point where the STM tip produces a highly localized and strong electric field. Balooch teaches producing an individual mark comprising ejection of a silicon atom. Such a method of marking a surface is not amenable to producing large scale patterns across the surface as required in many applications, due to the length of time needed to re-position the STM each time to produce an atomic scale mark and the $\sim 10^{10}$ or more atoms in a macroscopic device.

U.S. Pat. No. 5,129,991 issued to Gilton describes an alternative scheme for mask-free etching. An adsorbed etch-gas (a chloride or fluoride) is present on a substrate which has macroscopic regions fabricated from different materials having different photoemission threshold-values for the release of electrons. This substrate is illuminated with a wavelength of light selected to give electron emission from some regions but not from others. The emitted electrons cause etching to occur only on those regions of the substrate which are composed of materials with a low enough photoemission threshold to emit electrons; i.e., reaction is localised, but localised to macroscopic areas.

C. Yan et al., J. Phys. Chem., 99 6084 (1995), have reported that molecular chlorine impinging as an energetic (0.11 eV) beam of molecules on a Si(111) 7×7 substrate reacts directly from the gas to halogenate the substrate preferentially at surface silicon-atom sites which are adjacent to one another (70% adjacent, 30% non-adjacent). Though these chlorinated pairs of sites recur randomly across the surface, they constitute short-range order, i.e., a simple form of molecular-scale patterning.

It is well known that one can produce a pattern on a surface by adsorbing a weakly-bound layer of molecules which, in their most stable configuration, form a pattern. The existence of such adsorbate patterns has been shown incontrovertibly by Scanning Tunneling Microscopy (STM) which reveals the locations and separations of the adsorbate molecules (refs. 1–4). The origin of these spontaneously-formed molecular patterns has been the subject of theoretical analysis (e.g., refs. 5–7). The patterns are governed by the effect on the adsorbate of the regular arrangement of the atoms in the underlying crystal (termed the "substrate"), by the size and shape of the adsorbed molecules themselves which can interact with one another to form an adsorbate pattern due to that cause alone, and by the coverage which determines the inter-adsorbate separation and hence affects the favored pattern of adsorption. Through the choice of these variables (substrate, adsorbate and coverage) one obtains differing patterns. These adsorbate patterns repeat at intervals as small as a few atomic diameters.

Typically, what are termed 'adsorbate layers' have heats of adsorption of 0–1 eV. At the low end of this range they are said to be 'physisorbed', and at the high end 'chemisorbed'. They are adsorbate layers by virtue of the fact that they are subject to desorption, with a heat of desorption corresponding to the prior heat of adsorption, by warming the surface.

It would be advantageous to exploit the existence of these molecular-scale adsorbate patterns as a means to mark the underlying surface. This would provide an avenue to mask-free marking and, more importantly, to marking at separations at least a hundred times less than the lowest limit achievable through the use of the present procedures employing masks.

SUMMARY OF THE INVENTION

It is an object of the present invention to provide a process for marking solid surfaces with patterns of molecular dimensions. In the present invention a molecular-scale pattern, that derives from the presence of a pre-existent molecular-scale pattern in an adsorbate layer, is imprinted upon the surface. If an adsorbate is to be found attached to preferred sites at a surface, that recur at intervals across the surface, we refer to the adsorbate as 'patterned'.

The present invention provides a method of patterning a surface of a solid on a molecular scale, comprising:

providing a reactive solid having a surface;

forming a pattern of adsorbed molecules at sites on said surface of said reactive solid by providing a plurality of preselected molecules and exposing said surface to said preselected molecules;

exposing said surface to an effective blocking agent subsequent to exposing said surface to said preselected molecules to militate against surface diffusion of said adsorbed molecules; and forming an imprinted pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface, wherein said blocking agent does not imprint on said surface under irradiation.

The present invention provides a method of patterning a surface of a solid on a molecular scale, comprising:

providing a reactive solid having a surface;

exposing said surface to an effective blocking agent;

forming a pattern of adsorbed molecules at sites on said surface of said reactive solid by providing a plurality of preselected molecules and exposing said surface to said preselected molecules, wherein said blocking agent blocks preselected surface sites from said preselected molecules; and forming an imprinted pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface, wherein said blocking agent does not imprint on said surface under irradiation.

In another aspect of this invention there is provided a method of patterning a surface of a solid on a molecular scale, comprising:

providing a reactive solid having a surface;

forming a pattern of adsorbed molecules at sites on said surface of said reactive solid by providing a plurality of preselected molecules and exposing said surface to said preselected molecules; and forming an imprinted pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface, wherein said imprinted pattern includes a first imprinted pattern formed from first preselected electropositive atoms or molecules, said imprinted pattern including a second imprinted pattern formed from second preselected molecules wherein said first preselected electropositive atoms or molecules are selected to promote aggregation of said second preselected molecules into nanoscale sized clusters locally to binding sites where the first electropositive atoms or molecules are chemically bound to said surface.

The present invention provides a method of patterning a surface of a solid on a molecular scale, comprising:

providing a reactive solid having a surface;

forming a pattern of adsorbed molecules at sites on said surface of said reactive solid by providing a plurality of preselected molecules and exposing said surface to said preselected molecules; and forming an imprinted pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface, wherein said imprinted pattern includes a first imprinted pattern formed from first preselected electronegative atoms or molecules, said imprinted pattern including a second imprinted pattern formed from second preselected molecules wherein said first preselected electronegative atoms or molecules are selected to inhibit aggregation of said second preselected molecules locally to binding sites where the first electronegative atoms or molecules are chemically bound to said surface.

The present invention provides a method of patterning a surface of a solid on a molecular scale, comprising:

providing a reactive solid having a surface, said reactive solid being selected from the group consisting of metals and semiconductors;

forming a pattern of adsorbed molecules at sites on said surface of said reactive solid by providing a plurality of preselected molecules and exposing said surface to said preselected molecules; and forming an imprinted pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface.

In another aspect of the invention there is provided a method of patterning a surface of a solid on a molecular scale, comprising:

providing a reactive solid having a surface;

forming a pattern of adsorbed molecules at sites on said surface of said reactive solid by providing a plurality of preselected molecules and exposing said surface to said preselected molecules; and forming an imprinted pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface.

In this aspect of the invention the pattern of adsorbed molecules may include elongated conjugated chains along which electrical current can flow, including selected functional groups chemically bound to a selected constituent in said conjugated chains at intervals therealong, and wherein when said pattern of adsorbed molecules is irradiated said chemical bond between said functional group and said constituent is broken, and wherein a dangling bond from said selected constituent chemically binds to an atom in said surface of said substrate to anchor said elongated conjugated chains to said surface at said intervals along said conjugated chains.

In this aspect of the invention the preselected molecules may include at least one dopant atom which is either a p-type or an n-type dopant atom, and wherein said at least one constituent of the adsorbed molecule is said dopant atom.

In this aspect of the invention the substrate may include spaced electrically conducting electrodes formed on said surface, wherein said pattern of adsorbed molecules comprise elongated conjugated diene or aromatic chains along which electrical charge can flow, wherein each elongated chain includes a selected functional group chemically bound to a selected constituent in said elongated chains, and wherein when said pattern of adsorbed molecules is irradiated said chemical bond between said selected functional group and said selected constituent is broken whereafter said selected constituent forms a chemical bond with an electrically conducting electrode on said surface, and wherein the electrical contact between the electrically conducting electrode and the elongated chain chemically bound thereto is an ohmic electrical contact.

BRIEF DESCRIPTION OF THE DRAWINGS

The method of marking or patterning a surface on a molecular scale forming the subject of this invention will now be described, reference being made to the accompanying Figures, in which:

FIG. 1(a) to FIG. 1(b) are illustrative of the Scanning Tunneling Microscopy (STM) images from which the distributions of the individual ClBz (chlorobenzene) molecules and Cl (chlorine bound to Si adatoms) over the F (faulted) and U (unfaulted) halves of the Si(111)7×7 unit cells were obtained. FIG. 1(a) is an STM image of clean Si(111)7×7. The unit cell indicated is 0.00269 microns (26.9 A) along one side. FIG. 1(b) is a similar surface of FIG. 1(a) dosed with 1 L of ClBz. The dark shadows are the ClBz molecules; it is evident that they adsorb preferentially on the F sites. FIG. 1(b) shows two scans of a partially chlorinated region of an Si(111)7×7 surface (previously exposed to $Cl_2$, for this illustration). The dark shadows at −1 V show themselves to be Cl bound to Si since they "light up" (i.e., current flows) when the STM tip-bias is changed to −3V. Chlorobenzene (ClBz) does not "light up" in the range −1 to −3V.

DETAILED DESCRIPTION OF THE INVENTION

Figure 2:
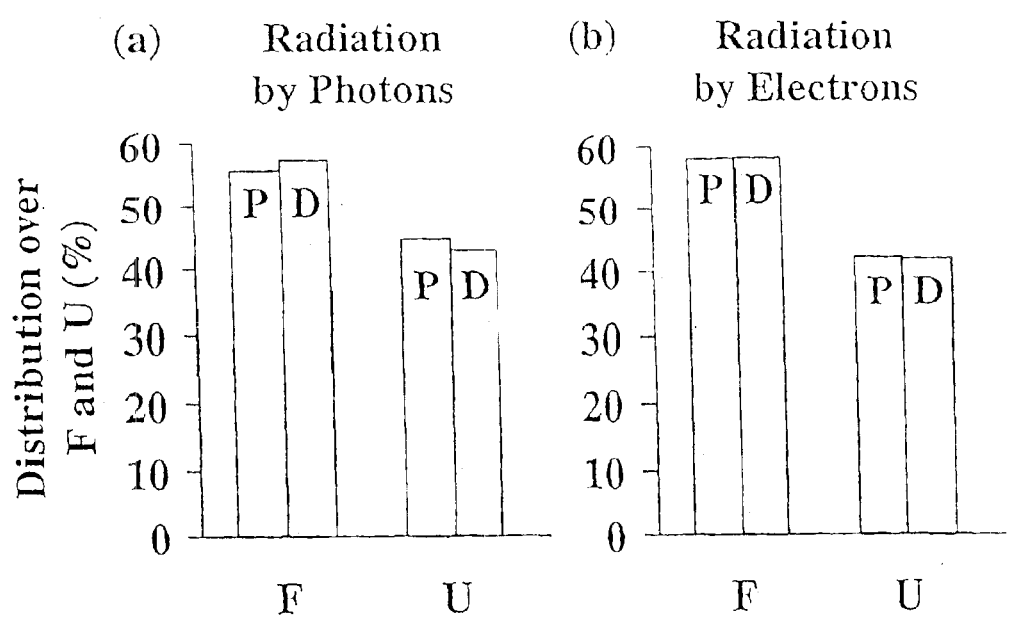
FIG. 2(a) is a bar graph obtained by counting individual ClBz molecules at an average coverage of 48% prior to irradiation, on F and U, and then counting Cl atoms, on F and U, which have been formed by irradiating the ClBz. The radiation was 193 nm ultraviolet from an excimer laser. Within the experimental (counting) error the F/U population ratio is the same for the parent ClBz (labeled 'P', for parent) as for the daughter Cl (labeled 'D'), indicative of "local" reaction. Both the ClBz and the Cl (P and D, respectively) are 27% more likely to be on the F sites than on the U sites at this ClBz coverage.
FIG. 2(b) shows a bar graph obtained by counting individual ClBz molecules at an average coverage of 38% prior to irradiation, on F and U, and counting Cl atoms bound to Si adatoms on F and U following irradiation by electrons.

The present invention provides a process for the formation of regular patterns upon solid surfaces, repeated at intervals of less than or of the order of 0.3 microns (3,000 A). The material to be marked is exposed to a gas or liquid that adsorbs to form, spontaneously, an ordered monolayer.

This ordering will in general be most complete if the adsorbate is "annealed", i.e., warmed sufficiently to render it mobile. In some cases (e.g., that exemplified here) the adsorbate is sufficiently mobile that annealing is unnecessary.

In one aspect of the invention there is provided a method of patterning a surface of a solid on a molecular scale. The method comprises providing a reactive solid having a surface;

forming a pattern of adsorbed molecules at sites on said surface of said reactive solid by providing a plurality of preselected molecules and exposing said surface to said preselected molecules; and forming an imprinted; pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface. In this aspect of the invention the reactive solid may be a crystalline solid or an amorphous solid.

In another aspect of this invention there is provided a method of patterning a surface of a solid on a molecular scale comprising exposing a surface of a reactive crystalline solid to an effective imprinting agent to form a pattern of adsorbed molecules on at least a portion of the surface; and imprinting a pattern on the surface by applying effective excitation energy to induce the adsorbed molecules to chemically react locally to their site of adsorption, with the surface.

Some factors governing the pattern of order in an adsorbate layer (substrate crystal structure, adsorbate molecular-shape, and coverage) were given in the previous section. We note here that control over adsorbate patterning can also be achieved using different crystal faces or by the deliberate introduction of patterned defects. Patterned defects are commonly obtained by cutting a substrate crystal at a known angle to create a predictable pattern of steps and terraces on the atomic scale (see ref. 8). A further means of obtaining patterned defects, now well established, is through the application of voltage or current pulses to the tip of an STM, which removes or adds atoms where the tip is applied (see ref. 9). Whichever of these means are used to introduce a pattern of defects at the substrate surface, a corresponding patterning will be obtained in the adsorbate layer that is subsequently deposited.

The ordered adsorbate layer on to the surface, may be excited by irradiation using light (photons) or charged particle bombardment (electrons or ions) so that a reaction between the patterned adsorbate and the substrate occurs. This has the consequence that the adsorbate pattern is imprinted upon the surface. Since the adsorbate pattern repeats at molecular intervals, so does the imprinted pattern.

The method of imprinting the adsorbate pattern disclosed herein relies upon exciting the adsorbate using generalized irradiation wherein the plurality of molecules making up the adsorbate pattern are simultaneously induced to chemically react with the surface. This permits a rapid imprinting of the pre-existent adsorbate pattern on a time scale which is determined by the irradiation time. For example, a pulse from a laser having a pulse width from nanoseconds to picoseconds may easily be used to imprint the entire pattern of $\sim 10^{10}$ atoms required for a macroscopic device—an improvement of some twenty orders-of-magnitude in time required as compared with atom-by-atom construction.

In one aspect of the invention the surface is imprinted by the intact adsorbate molecule which has been excited by irradiation of the adsorbate and surface.

In another aspect of the invention the surface is imprinted by a chemically reactive fragment formed from the adsorbate molecule as a result of the joint irradiation of the adsorbate and substrate.

In one aspect of the invention the agent which excites the adsorbate is the direct absorption of ultraviolet radiation by the adsorbate molecules.

In another aspect of the invention the agent which excites the adsorbate is the impact of substrate electrons at the sites of adsorbed molecules, these substrate electrons having themselves been excited by impacting photons, electrons or ions which energize a portion of the substrate electrons.

In a variant on substrate-mediated adsorbate excitation, electronic excitation of the substrate leads to energy-transfer to the adsorbate without transferring an electron, by the so-called 'electronic-to-electronic energy-transfer' mechanism.

The above aspects contribute to the example of chlorobenzene adsorbed on a silicon wafer irradiated by ultraviolet radiation, or electrons disclosed herein. The novelty, and unexpectedly surprising results forming the present invention, consists not in the presence of patterned adsorbates, nor in the direct photoexcitation and photodissociation of adsorbates, nor in the electron-impact excitation and dissociation of adsorbate by substrate electrons, nor in the use of an external electron beam to induce adsorbate excitation and reaction, nor in the use of other charged-particle beams namely ions to induce adsorbate excitation, but in the localised nature of the ensuing reaction, which is responsible for the transference of the adsorbate pattern to the substrate.

A variant of the invention disclosed herein is that electrons coming from an external source can take the place of light as the primary agent that excites the patterned adsorbate and causes it to imprint its pattern upon the underlying surface. Electron irradiation and photoirradiation are known to have comparable effects. It follows that other charged particles, namely charged molecules termed ions, can also be used for irradiation.

The reaction of the irradiated adsorbate with the substrate may equally-well be that of an excited intact adsorbate molecule, or of a molecular fragment of that molecule, or of its atomic fragment. Following the reaction the product may be chemically bound at the surface (localised "writing") or imbedded in the surface (localised "doping") or may evidence itself as a localised removal of surface atoms as a consequence of the localised reaction (localised "etching") or evidence itself by the preferential atomic-scale pitting of the surface at the site of attachment of a chemically-bound species in the course of subsequent irradiation. The last scenario makes it possible to translate the patterned attachment of chemical groups ("writing") described here, into a similar pattern of "pits" ("etched" hollows, one or more atoms in diameter) thus further extending the range of useful application.

A further aspect of this invention is its "reinforcing" nature. Successive adsorption-irradiation cycles will cause the annealed adsorbate layer (prior to irradiation) to seek out, or in some cases, avoid, the sites at which the first pattern was imprinted. Thus, by way of example, adsorbates will collect preferentially in the region of a "pit" in the surface to form a pattern. When, therefore, a second application of adsorbate is followed by irradiation, reaction will occur once more preferentially at the sites of the prior imprinting (this being in general the site of secondary adsorption). Thus secondary and subsequent patterned-adsorption plus irradiation-imprinting can be used to enlarge, or chemically change, a primary imprint. The primary imprint, it should be understood, may have been made by the present method or alternatively by the tip of an atomic writing/etching instrument such as the Scanning Tunneling Microscope (STM) (see ref. 9). This "reinforcing" application will be important in permitting the uses of this method of adsorption-plus-irradiation to increase the size of primary "pits" in secondary and subsequent "etches", and to write or dope with selected chemical agents in the vicinity of prior marks.

Since each reactive or etching event is triggered by the arrival at the adsorbate-plus-surface of a photon, electron or ion, and since the number of such photons or electrons is readily counted and controlled, both the primary and subsequent reaction, dope, or etch, is controllable as to the number of atoms involved. What is being described is, therefore, a means for patterned writing, etching and doping that is subject to digital control.

The method for marking a surface on an atomic or molecular scale disclosed herein will be described and illustrated hereinafter using a non-limiting, illustrative example in which a crystalline silicon wafer is marked, using as the adsorbate molecule, chlorobenzene. However, it is to be understood by those skilled in the art that the invention is in no way limited to this system but rather the chlorobenzene-silicon system serves only to illustrate the principles of the present invention. As used herein, the phrase "imprinting agent" refers to species (liquid or vapor) which, when exposed to the surface of a reactive solid, forms an adsorbate pattern on the exposed surface.

At the outset of the illustrative studies used to demonstrate the principle of the method of marking forming this invention, a clean Si(111)7×7 wafer at room temperature was shown to be free of contamination at the atomic level by means of Scanning Tunneling Microscopy (STM). The wafer was then exposed to approximately 1 Langmuir (1L; $10^{-7}$ torr for 10 seconds) of chlorobenzene vapour in an ultrahigh vacuum vessel. The vessel was then re-evacuated to ultrahigh vacuum (UHV). All experiments were performed under UHV. Re-examination of the surface by STM showed partial coverage of the surface by chlorobenzene (ClBz) molecules which evidenced themselves as dark spots of roughly molecular dimensions, i.e., as locally reduced current from the negatively charged STM tip (−1V) to the crystal. As expected the chlorobenzene molecule was stable in the adsorbed state on silicon.

FIGS. 1(a), 1(b) and 1(c) illustrate the type of scanning tunneling microscopy (STM) data from which the essential findings disclosed in FIG. 2 discussed hereinafter were obtained. The STM images show clean silicon (Si(111)7×7), ClBz covered silicon, and Cl covered silicon. Atomic chlorine can be distinguished from the chlorobenzene by increasing the negative tip-bias to −2V or −3V, whereupon the chlorobenzene dark spots are unaffected, but the dark spots corresponding to Cl become bright. It should be noted that the spots correspond to individual ClBz molecules or Cl atoms.

The locations of the dark spots for the chlorobenzene molecules constituted a pattern that repeated itself across the Si surface. The spots were predominantly located on the faulted (F) half of each unit cell rather than on the unfaulted (U) half (FIG. 1). This selectivity decreased with increasing coverage. This suggests that the marked preference for F over U is due to stronger adsorbate-to-substrate (ClBz to Si) bonding for F than for U rather than to adsorbate-adsorbate (ClBz-ClBz) interaction.

Ordering of the adsorbate need not in all cases be due to adsorbate-substrate forces, but can be due to adsorbate-adsorbate interactions as in so-called "SAMs" (Self-Assembled Monolayers, made up, for example, of long-chain molecules) which favour patterned geometries even on amorphous solids. In this case, however, the extent of adsorbate ordering will increase with increasing coverage. An example of SAM-type behavior is likely to be that of brominated long-chain hydrocarbons which have been shown to form highly-ordered adlayers on graphite at ~1 ML coverage (see ref. 4).

The chlorobenzene on silicon, used here, distributes itself in a recurring pattern over the F and U sites. The triangular F and U sites alternate across the entire silicon-wafer surface. The separation between the site centers, F and U, is 0.00155 microns (15.5 Å). The triangles (a pair of which, F+U, make up each unit cell) are equilateral with sides of 0.0027 microns. Patterned adsorption over F and U is achieved at room temperature without annealing. By analogy with benzene (see ref. 2), it is thought that the monochlorinated benzene employed here at first adsorbs weakly in a mobile "precursor" state and then chemisorbs (with a heat of adsorption of ~1 eV) at the preferred site. The binding in the chemically-adsorbed condition is believed to involve a benzene ring (or in the present case a monochlorinated benzene ring) lying approximately flat upon the surface with its delocalized π-bonds overlapping the surface dangling-bonds located on the Si adatoms.

Those skilled in the art will understand that the experimental findings disclosed herein do not depend upon the correctness of the foregoing interpretation of the nature of the binding. Moreover, the theory being qualitative in nature does not purport to explain the preference for (benzene and) chlorobenzene adsorption at F in preference to U sites. Preferential binding of adsorbates to particular sites at surfaces (i.e., to particular atoms, or arrangements of atoms as in the case of the faulted half of the unit cell termed F) is a well known phenomenon. Since the preferred sites recur at regular intervals across the surface, the adsorbate molecules also recur, forming a pattern.

The experiments reported herein illustrate not only adsorbate patterning (required for the method disclosed herein) but also that effective excitation, such as by irradiation of the surface of a reactive solid, produces a pattern imprinted on the surface (a second requirement of the present method). The example of photopatterning that is disclosed herein is one in which a pattern of atoms is deposited on the surface in a chemically-bound state as a result of irradiation by ultraviolet or irradiation by electrons. Central to the present method of photopatterning is that the adsorbate pattern or a closely-related one is imprinted on the surface by radiation-induced reaction with the surface, which reaction is localised to regions adjacent to the adsorbate molecules. Localisation may be so complete as to restrict reaction to the site of adsorption, though in the example of ClBz (as we show) the preference is for reaction at the neighboring atom (see FIG. 3). It is only if reaction is "localised" that it will transfer the adsorbate pattern to the surface.

It will also be understood by those skilled in the art that statistically, not every molecule forming part of the adsorbate pattern will necessarily react and/or be imprinted but a majority of the adsorbate molecules reacting locally to their site of adsorption will be sufficient to imprint an effective adsorbate pattern.

The existence of molecularly "localised scattering" of photofragments from substrates has been known, see refs. 17, 18. The surprising new finding disclosed herein, namely "localised reaction", takes the place of "localised scattering" when (due to such factors as the impact energy at the scattering site, the angle of impact and the nature of the impacted atom(s)) the localised scattering event is pre-empted by a localised perturbation of the surface leading to bond-formation at the site of impact. Hence the molecular or atomic species that would have been "scattered", instead "reacts" to bind chemically with the substrate surface to form, under the prevailing experimental conditions, involatile or (in the case of etching) volatile product. Reaction, rather than scattering, was obtained by replacing the inert halide substrate used in the scattering studies by the silicon employed here, well known to be reactive. It is recognised however, that even an "inert" substrate can exhibit reaction if the impacting species are themselves sufficiently reactive and energetic.

In view of the mobility of many species at surfaces, particularly energetic species formed as a result of radiation, the existence of localised reaction was not evident prior to its being demonstrated in the experiments disclosed herein. We return to this point later in this disclosure.

As we have noted, it is not the adsorbate patterning, described above, but the method that exploits such patterns through imprinting that constitutes the present invention. In the case that the adsorbate is chlorobenzene, the silicon surface has been imprinted on by irradiation of the adsorbate, as a pattern of chlorine atoms attached to Si dangling bonds not already occupied by the chlorobenzene adlayer. On the basis of extensive prior work (for example see ref 19) it is known that irradiation by ultraviolet (UV), or (in the case of low work-function materials) visible light, or irradiation by an external electron beam (see for example refs. 13, 14) causes reactions to occur. Such reactions may be initiated by photodissociation of the adlayer, or by interaction of the intact electronically-excited adlayer molecules with the substrate. Both categories of reaction can be assisted by the heating of the surface by the irradiation. The irradiation-induced reaction mechanisms will be reviewed shortly.

First, however, we report the observation disclosed herein that is central to the method claimed. The observation in question is that the irradiation-induced reaction occurs locally so as to imprint the adsorbate pattern, or a closely related pattern, on the underlying substrate. This has been demonstrated, in the examples given herein, by determining the adsorbate pattern on the atomic scale using STM, and comparing this with the pattern of reaction-product on the surface, also determined on the atomic scale using STM.

FIG. 2 is a bar-graph from the present work showing that the pattern of adsorbate molecules (chlorobenzene at approx. 0.4 monolayer mean coverage) is converted, in FIG. 2(a) by irradiation using a 193 nm excimer laser irradiation, and in FIG. 2(b) by electrons from an STM tip pulsed to −4V (while held at the normal −1V distance from the surface) into a similar pattern of imprinted Cl over F and U sites on Si(111)7×7. Following irradiation with 193 nm (typically $10^3$ pulses at 90 mJ/cm$^2$·pulse) or a single pulse of electrons (current of several nanoamps), and only following irradiation, the STM revealed the presence of Cl at the surface. The Cl bonded to the surface as Cl—Si showed up as additional dark areas at −1V that, in contrast to chlorobenzene adsorbate dark areas, became light when the tip voltage was changed to −2V or greater negative voltage, as illustrated in FIG. 1. These dark areas at −1V, which became light at −2V, were found to be a consequence of the irradiation, showing that Cl—Si had been formed by irradiation of ClBz adsorbed on the surface.

The major difference between FIG. 2(b) and FIG. 2(a) is that in this former FIG. (2(b)) the irradiation was by electrons. The electrons were obtained by pulsing the tip of the STM, located over the ClBz-covered Si(111)7×7 surface, to −4V. During the −4V pulse the tip was locked at a fixed distance close to the surface; the distance for −1V tunneling spectroscopy at a 0.09 nA current. In order to sample randomly a sufficient area of the surface to dissociate a representative number of ClBz, the tip was scanned along a distance of 1180 Å with repeated −4V pulses applied. (A portion of the line of Cl atoms obtained in this experiment will be shown in FIG. 4(b), below.) The measured F/U population ratio from radiation by electrons was, as for photon irradiation, the same for the parent ClBz (P) as for the daughter Cl (D), indicative of "local" reaction. The patterning of the daughter atoms clearly corresponds to, and derives from, the pattern of parent molecules. The STM tip in this case serves merely as a convenient source of low-energy electrons.

The same result has been obtained by the applicants in experiments in which the STM tip instead of being moved along a single long line was rastered over the entire region of the adsorbate surface (approx. 100 nm×100 nm) that was to be patterned. Clearly the STM tip was not being used in this instance to write a pattern, but to imprint a pre-existent pattern in the adsorbate onto the surface by electron-induced reaction. The requirement for patterning was not in this instance a specific motion of the STM tip, but a sufficient motion so as to irradiate a representative sample of the surface, and the adsorbate on the surface, with low-energy electrons. This requirement is the same as for patterning with light (a non-localised source of irradiation). When the STM tip is used, as it is here, to distribute low-energy electrons broadly across the adsorbate-covered surface, the process under study is the "Molecular Scale Pattern Imprinting At Surfaces," which forms the subject of this patent.

The ratios F/U given in FIG. 2 for the parent molecule, P, namely adsorbed ClBz, and the corresponding ratio for the daughter species, D, namely Cl—Si, are identical to within the estimated measurement error in determining F/U. The ratio F/U was obtained by recording the location of the individual ClBz molecules and Cl atoms (the latter in the form of Cl—Si) by STM.

As already noted, all experiments were performed under UHV, so gas-phase dissociation by the irradiation was negligible. Those skilled in the art will understand that this process is not limited to UHV, but can be utilised wherever ordered adsorbates are in contact with substrates.

The mechanisms by which irradiation could trigger reaction to break the Cl—C bonds which are present in chlorobenzene and form Cl—Si bonds at the surface, will be discussed later. It involves speculation that goes beyond what is essential to the invention. Referring again to FIGS. 2(a) and 2(b), a very surprising observation is that the distribution of Cl over F and U sites at the Si crystal surface was, within experimental error, indistinguishable from that of ClBz. (This, it should be noted, would not be the case if atomic Cl formed in the gas-phase were to impinge at the surface, since this would distribute Cl randomly).

The agreement between the distribution of the daughter fragments, Cl, over F and U sites with the distribution of the parent molecules, ClBz, over these same sites, leaves no doubt that the irradiation causes localised reaction at the Si surface. This surprising result, namely the finding of localised reaction proves the principle on which is based the method of molecular-scale irradiation-induced patterning disclosed here.

Figure 3:
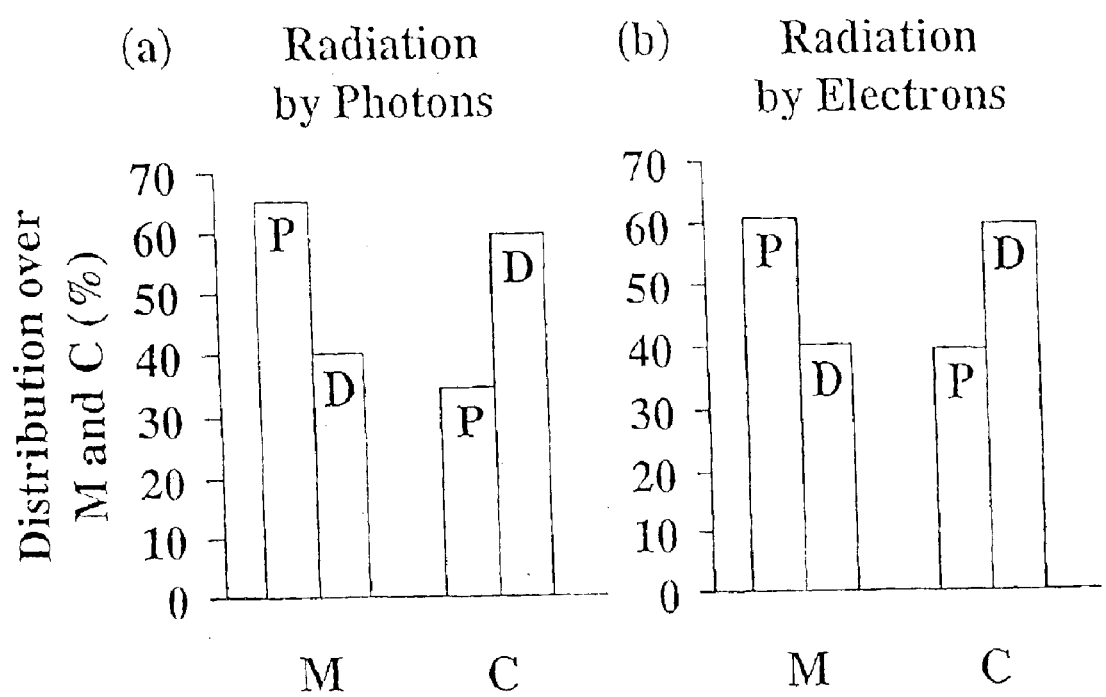
FIG. 3(a) shows a bar graph showing the distribution of parent (ClBz) and daughter (Cl) species over adjacent atomic sites termed "middle atoms" designated (M) and corner atoms labeled (C) following irradiation by photons.
FIG. 3(b) shows a bar graph showing the distribution of parent (ClBz) and daughter (Cl) species over adjacent atomic sites termed "middle atoms" designated (M) and corner atoms labeled (C) following irradiation by electrons.

In the foregoing we have compared two areas, F and U, on the Si(111)7×7 surface with respect to parent and daughter (P and D) patterns of distribution. In FIG. 3 (recorded once more at approx. 0.4 monolayer average coverage) we make a still more detailed analysis, comparing the patterns of P and D over atomic sites.

FIGS. 3(a) and 3(b) illustrate a different finer type of patterning, co-existent with that illustrated in FIGS. 2(a) and 2(b). The previous patterning of FIG. 2 related to the fact that specific areas on the Si(111)7×7 surface are spontaneously more densely covered with ClBz (parent molecules, P) and consequently more densely covered with Cl (daughter molecules, D) following generalized irradiation by light or electrons. FIGS. 3(a) and 3(b), by contrast, report the observed distribution of 'parent' and 'daughter' (P and D) over adjacent atomic sites termed (as is customary) 'middle atoms' designated 'M', and corner atoms labeled 'C'. (On Si(111)7×7 the perimeter of a triangular F or U area is made up of three silicon adatoms, namely a middle adatom, M, flanked by two corner adatoms, C). In FIG. 3(a) (47% ClBz coverage) it is evident that the ClBz (P) adsorbs with a strong preference for middle atoms (M). It is also evident that following irradiation by photons the daughter Cl (D) has a comparably strong preference for corner Si-atoms (C). This was determined by counting the ClBz and Cl located on M and on C Si atomic-sites. A virtually identical patterning over atomic sites was obtained, shown in FIG. 3(b), when irradiation was by widespread electron irradiation. (In FIG. 3(b) the mean coverage was 38%; the conditions for electron irradiation were those described for FIG. 2(b) above). The interpretation is that parent molecules on M Si atomic-sites tend to react at the adjacent C, consequently a molecular pattern of adsorbate favoring M results, following irradiation, in an atomic pattern favoring C. (Close examination has shown that approx. 5% of the parent ClBz molecules on M sites, following irradiation, attach their daughter Cl not at an adjacent C site but at an adjacent 'R' site, where R symbolises a rest-atom in the second layer of Si. We have included this small percentage in the bar labeled C, since both C and R are adjacent to M).

The spontaneous pattern of parent adsorption is such that the parent P prefers middle adatoms (M) by almost a factor of two over corner adatoms (C). The reverse preference is evident for the daughter D, which prefer C to M. This is equally true for photon irradiation (at 193 nm) or electron irradiation (from an STM tip rastered across the surface and pulsed to −4V at numerous locations randomly chosen). What this shows is that a pattern of adsorption of 'P' (ClBz) on M sites imprints as a pattern of daughter-atoms "D" (Cl) on the adjacent C sites. The reaction is 'localised' in this case within one atomic Si—Si adatom separation. This localised reaction is sufficiently surprising to warrant a third proof, embodied in FIG. 3 below.

Figure 4:
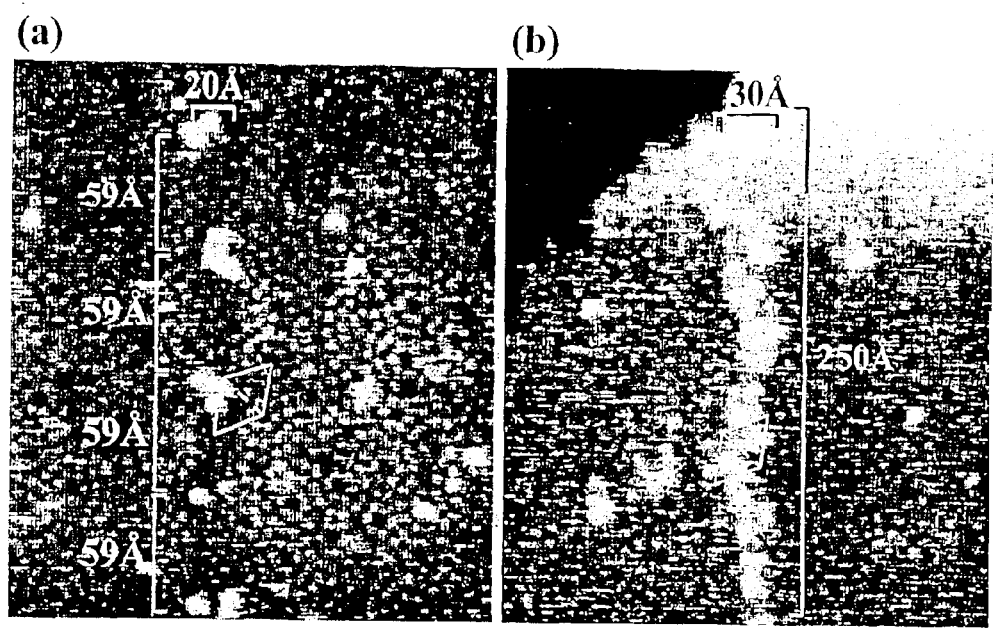
FIG. 4(a) shows a pattern of Cl atoms produced by irradiation using electrons from a scanning tunneling microscope (STM) tip of ClBz adsorbed on Si(111)7×7. The interrupted line of white spots was recorded with the tip at −3V, at which voltage Cl atoms 'light up' to form white spots. The −4V pulses at the STM tip were spaced at equal intervals of approximately 59 Å.
FIG. 4(b) shows a pattern of Cl atoms produced by irradiation using electrons from a scanning tunneling microscope (STM) tip of ClBz adsorbed on Si(111)7×7. the continuous line of white spots was recorded with the tip at −3V. For this experiment the −4V pulses were applied in rapid sequence (approx. every 29 Å) to the STM tip as it moved down the figure from top to bottom and the irradiation-induced reaction gave rise to a continuous line of Cl atoms. The line of white spots was recorded with the tip at −3V, at which voltage Cl atoms 'light up' to form white spots.

FIG. 4 gives direct evidence for the fact that spatially "localised reaction" is the reason that parent adsorbate patterns (whether over areas F and U, or over adjacent atomic-sites M and C) are transformed by irradiation into patterns of the daughter. The interrupted line of white spots in FIG. 4(a) and the continuous line of white spots in FIG. 4(b) (both recorded with the tip at −3V, at which voltage Cl atoms 'light up' to form white spots) show Cl atoms formed by electron-impact induced reaction of ClBz adsorbed on Si(111)7×7. (See the captions to FIGS. 2(b) and 3(b) for the experimental conditions of electron-impact). In the case of FIG. 4(a) the −4V pulses at the STM tip were spaced at equal intervals of approx. 59 Å, whereas in the case of FIG. 4(b) the −4V pulses were applied at intervals too short to be readily resolved (namely approx. 29.5 Å). In FIG. 4(b) the irradiation-induced reaction gave rise to a continuous line of Cl atoms at the surface, and in FIG. 4(a) to a line broken at equal intervals of approx. 59 Å corresponding to the electron-pulse separation. For the continuous line the width was approx. ±15 Å, and for the broken line approx. ±10 Å. In each case the localisation of the Cl's (in one dimension for FIG. 4(b) and in two dimensions for FIG. 4(a)) was clearly a consequence of localised electron-impact giving rise to "localised reaction". This "localized reaction" is, therefore, the cause of the transference of 'parent' adsorbate patterns to 'daughter' reaction-product patterns, i.e., the cause of the pattern-imprinting which forms the subject of this patent.

It should be noted that the use of the STM tip here to write geometrical patterns, specifically lines or dotted lines, has a limited purpose. It is intended to demonstrate that electrons impacting on the adsorbate-covered surface cause surface-reaction that is restricted to the molecular-region of impact. It follows that this adsorbate molecule when energised by an impacting electron, reacts to attach an atom to the surface locally. 'Localised Atomic Reaction,' required for the transfer of an adsorbate layer pattern to a pattern chemically bound to the surface, is thereby demonstrated. The process of writing patterns with the STM tip is not, however, the subject of this patent in which the pattern imprinted is one that exists in the adsorbate rather than one that is determined by a restricted path followed by an STM tip.

In FIG. 4 the most prominent pattern of the Cl atoms imprinted on the Si(111)7×7 surface (the light dots are individual Cl atoms) is due to the pattern of the electron-irradiation of the ClBz adsorbate layer. In FIG. 4(a) the electron pulses were separated by a fixed distance of approx. 60 Å in the vertical direction. The areas of irradiation-induced imprinting of Cl on the surface can be seen to be separated by the same distance, showing that the daughter, D (i.e., Cl), is bonded to the surface where the parent, P (i.e., ClBz), molecule was dissociated. Had the daughter, Cl, drifted across the surface there would have been no pattern of dots, nor would those dots have lain (as they do) in a line. The same conclusion in regard to the localised reaction of Cl can be drawn from FIG. 4(b). For this experiment the −4V pulses were applied in rapid sequence (approx. every 29 Å) to the STM tip as it moved down the figure from top to bottom. The result is a continuous line of Cl atoms in contrast to the broken line of FIG. 4(a). The localisation of the reaction is evident from the narrow width of the line which sets an upper limit of ±15 Å on the motion of the daughter D away from the point of dissociation of the parent, P.

The data for FIGS. 3(b) and 4(b) were taken from the distribution of the Cl atoms of FIG. 4(b) over F and U areas, and over M and C atomic-sites, since the total electron irradiation along the length of the line illuminates a representative sample of the adsorbate, i.e. it is equivalent to generalized electron irradiation. (Only a portion of the line used for FIGS. 2(b) and 3(b) is shown in FIG. 4(b), for illustration).

When, for investigative purposes, localised reaction was induced by highly localised electron irradiation, as was the case for the dots in FIG. 4(a), the irradiated ClBz were no longer representative of all ClBz. By repeatedly irradiating U sites in preference to F the experiment recorded in FIG. 4(a) showed localised reaction to the extent that F/U was 42/58; an inversion of the normal pattern of reaction which (see FIGS. 2(a) or 2(b)) consistently gave F/U>1. For this to be observed, reaction must be narrowly localised to the vicinity of electron impact.

The evidence of FIGS. 2–4 demonstrates localised reaction, beyond doubt.

The fact that irradiation of the adsorbate+substrate gives rise to localised reaction, thereby transferring the pattern of adsorbate to the substrate, has not previously been demonstrated, nor could this surprising result have been assumed to be the case in the absence of experimental proof. It has been noted above that the parent adsorbate molecule, chlorobenzene, adsorbed at room temperature, even with no excess energy, is initially highly mobile on the surface. Correspondingly, electronically-excited adsorbate, ClBz*, or the adsorbed negative ion ClBz$^-$, formed by irradiation, or the atomic chlorine into which it dissociates, might have proved, when first formed at the surface, to be similarly mobile, thereby losing its "memory" of the patterned arrangement of the parent ClBz and consequently failing to react to form a pattern at the surface.

According to this plausible scenario irradiation of the patterned adsorbate would give rise to a random imprint at the surface. This outcome (which is not, however, the outcome found in the present invention) is rendered still more plausible by the fact that Cl (unlike ClBz) is for the most part released at the surface, following energetic irradiation such as UV, or electron impact, with a substantial initial translational energy, in the electron-volt range. Since, as shown in FIGS. 2–4, the Cl reacts at the surface in a highly localised fashion deriving from the distribution of the parent molecule ClBz or the position of the ClBz molecule when it was excited by localised radiation, it appears that this excess translational energy carries the atom through any loosely-bound mobile-precursor state, of the type postulated for ClBz, directly into the strongly chemically-bound state Cl—Si The Cl—Si has a substantial binding energy, in the region of 4–5 eV (see for example refs. 15).

A further possible rationale for the observed localised outcome is that translationally-excited Cl is never present as a free atom but promptly undergoes an exchange reaction in which excited ClBz* or the ClBz$^-$ formed by irradiation breaks its Cl—C bond simultaneously with the formation of a Cl—Si bond of comparable strength binding Cl to the surface. Since such an exchange reaction can occur on a time-scale of femtoseconds, there is no opportunity for extensive migration across the surface. We have obtained circumstantial evidence for this type of irradiation-induced reaction as a mechanism for halogenating a reactive substrate (silver in that case) in earlier work (see for example ref. 10, 11). The earlier work did not, however, give any evidence whatever as to the localised or delocalised nature of the outcome since we had no tool (such as STM) for locating the site of reaction.

Those skilled in the art will appreciate that the molecular mechanics of the exchange reaction postulated in the previous paragraphs does not constitute an element in the invention. The same applies to the discussion of the ways in which irradiation can be effective in triggering the reaction, to be discussed below.

The mechanisms by which irradiation triggers adsorbate reaction are (a) through the direct absorption of radiation by the adlayer to form reactive electronically-excited molecules at the adsorbate-surface interface (see ref. 7, 19), (b) through electronic excitation in the substrate (for semiconductors this is likely to involve formation of electron-hole pairs at or near the surface) followed by electronic-to-electronic energy-transfer to the adsorbate to yield reactive excited-states of the neutral adsorbate (see ref. 12), (c) through electronic excitation in the substrate (as in (b)) but followed by the transfer of charge to or from the adsorbate to yield reactive adsorbate ions (see ref. 10, 11), and finally (d) in the case of bombardment with an external electron-source which can result in (a) (b) or (c), there is additionally attachment of impacting electrons to the adsorbate with subsequent reaction of the adsorbate anion (negative ion) or its dissociation products (see ref. 13, 14). The 193 nm irradiation of chlorobenzene adsorbed on a silicon wafer, described herein, is believed to involve processes (a), (b) and (c) (direct excitation, energy-transfer excitation and electron-transfer excitation) in relative amounts that are unknown but need not be known in order to effect the photopatterning. The electron irradiation of chlorobenzene adsorbed on a silicon wafer, also described here, is likely to involve pathway (d) prominently, but can also include a contribution from (a)–(c).

While photoirradiation or electron beam bombardment has been the preferred means for exciting the adsorbate or substrate in work until now, it will be understood that particle bombardment by, for example, positively or negatively charged ions may be preferred in some circumstances.

Those skilled in the art will appreciate there are numerous uses to which this method of photo-impact, electron-impact or ion-impact patterning of surfaces can be put. Broadly they are irradiation induced "writing", "doping", and "etching", all under digital control since in each application the number of photons, electrons or ions "in" determines the number of atoms "out". "Writing" involves deposition at the surface; in this case the output (designated "out" above) is material attached to the surface. This is exemplified herein by the example of patterned chlorination at the surface of silicon. "Doping" will be the output if the written material is buried, either because its recoil-momentum away from the excited parent molecule drives it into the surface, or if, following its deposition at the surface, it is buried by subsequent growth of one or more additional layers at the surface. In either case, patterned "doping" represents a minor variant on patterned "writing", the important step in each case being the same, namely radiation-induced localised reaction. The "etching" output involves an entirely comparable localised removal of surface atoms. With some substrates this can be achieved "directly" by abstraction reaction from the surface, such as that involving energetic halogen atoms. The preferred agent for localised reaction would then be a fluorine-containing adsorbate molecule, for example fluorobenzene rather than chlorobenzene, a minor variant. The essential requirement for direct etching is that the patterned reaction give a product that is a vapour, or can be vaporized by heating. Localised etching can also be achieved through a two-step process, which has been exemplified and demonstrated. The first step is patterned photochlorination disclosed herein, and the second is further UV irradiation at 193 nm which has been shown to give preferential photoejection at the site of chlorination. Both these steps are "digitally" controlled processes (see ref. 15).

Successive adsorption-irradiation cycles will cause the annealed adsorbate layer (prior to irradiation) to seek out the sites at which the first pattern was imprinted, thus "reinforcing" the first imprint. Thus adsorbates will collect preferentially in the region of a "pit" in the surface to form a pattern (see ref. 16). When, therefore, a second application of adsorbate is followed by irradiation, reaction will occur once more at the sites of the prior imprinting (this being the site of secondary adsorption). Thus secondary and subsequent patterned-adsorption plus irradiation-imprinting can be used to enlarge, or chemically change, a primary imprint. The primary imprint may have been made by the present method or alternatively by the tip of an atomic writing/etching instrument such as a STM (see the results reported in FIG. 4, or see ref. 9). This "reinforcing" application will be important in permitting the uses of this method to increase the size of primary "pits" in a secondary and subsequent "etches", and to write or dope with selected adsorbates in the vicinity of a prior mark.

A valuable ancillary tool in the imprinting of molecular patterns on surfaces are what we term "blocking agents". The term "blocking agents" as used herein is refers simply adsorbate molecules which preferentially block some adsorbates sites, without being directly involved in the molecular imprinting. We distinguish four modes of "blocking". (a) The parent molecule, P, may be present at sufficiently high coverage that a dissociating P has its daughter fragments, D, trapped in a matrix of surrounding undissociated, P. This ensures that P does not move under irradiation, and also that D reacts in the close vicinity of its parent, P. (b) In a comparable mode of blocking an inert blocking agent, B, is adsorbed on vacant sites at the surface, after P has been adsorbed at the desired coverage. We have used benzene for this purpose. It does not imprint on the $SI(111)7 \times 7$ surface during our 193 nm laser pulse since it does not photoreact or photodissociate at this wavelength or power (90 mJ per pulse). It does, however, give evidence of blocking. (c) Both (a) and (b) can affect the pattern that is imprinted, not only by preventing movement of P but also by deflecting the daughter D to previously inaccessible surface sites adjacent to the dissociated P. Thus, when benzene is used as a blocking agent for chlorobenzene we found that the Cl reacted (locally) with the silicon 'dimer pairs' that lay along the perimeter of each unit cell. The 'dimer pairs' are situated on the surface at a lower level than the adatoms. It may be presumed that the blocking agent, benzene, deflected Cl downward to these new sites. The reaction was still localised, but was a localised reaction of a novel type. (d) Finally we note that a blocking agent, B, may be used to advantage when adsorbed prior to the deposition of the marking agent, P. By occupying sites that would otherwise be available to P the presence of B blocks those sites and alters the pattern of P. Following irradiation there will then be a commensurate change in the imprinted pattern of D.

It will be recognized that 'blocking' in one of its aspects serves to lock parent molecules in place, by trapping them in a two (or three) dimensional matrix. Thereafter they can be dissociated and imprinted on the surface by irradiation. In a variant on this procedure we have found that, even in the absence of a blocking agent, we can in some cases 'cement' the parent, P, to the surface with light.) Thus chlorobenzene, we find, has a high probability of becoming chemically-bound ('cemented') to the $Si(111)7 \times 7$ substrate under 193 nm radiation. This cementing is evidenced by a marked increase in the energy required for the desorption of the parent ClBz following irradiation. (This refers to the majority of P, which are not photodissociated). If, then, 193 nm radiation were used initially to cement P in a pattern to the surface, further irradiation of whatever kind could be used to dissociate P to yield a patterned imprint of D without movement in P. No blocking agent would be required. Both 'blocking' (by P) and 'cementing' (i.e., radiation-induced bonding) may have assisted in the successful pattern-imprinting evidenced in FIGS. 2–4.

Since adsorbates (especially following annealing to a temperature slightly below the desorption temperature) generally show ordering due to one or both of the two causes given above (namely patterned bonding to an ordered substrate surface or ordering due to adsorbate-adsorbate forces) a wide range of adsorbates can be used in this molecular-patterning approach. The further requirement that the adsorbate reacts with an underlying solid following irradiation by photons, electrons or ions will also be met when bond-rupture in the adsorbate molecule gives rise to energetic highly-reactive free radicals including reactive atoms which can chemically react with the surface of the solid. We note (as we have found in our work on photoinduced reaction with surfaces; ref. 10) that it is not necessary for the irradiated adsorbate to dissociate prior to reacting with the surface. More commonly the excited or electrically-charged adsorbate reacts concurrently with dissociation; in effect the reactive surface (such as $Si(111)7 \times 7$) pulls the excited adsorbate (such as $ClBz^-$) apart. The selection of imprinting agent which forms the adsorbate can be made from a large number of gases that have been used for radiation-induced writing and doping (e.g., halides, hydrides and oxides, metal organics, compounds of Si, Ga, As and In etc.—all well known to those skilled in the art of Chemical Vapor Deposition, CVD) and gases used for plasma-etching (the most effective agents in this case being fluorides).

The effect of localized chemical 'marking' (i.e., chemical bonding), of etching (i.e., pitting) or of doping (i.e., insertion) is well known to be an alteration in the energy states of surface electrons in the immediate neighborhood of the marking, etching or doping. Thus W. Ho and co-workers (see ref. 20) have shown that when an electropositive atom (K) was distilled onto a metal ($Cu(111)$) or semiconductor ($Si(111)$) surface there was an increased yield of photoproducts from co-adsorbed molecules ($Mo(CO)_6$) and a shift to longer wavelengths (lower energy) in the light needed to produce photoproducts from the $Mo(CO)_6$. This was interpreted as being due to a local increase in the energy of the surface electrons, i.e., a decrease in the local 'work function' (the energy required to remove an electron from the solid). The decrease in local work function in the neighborhood of the K is thought to increase the accessibility of the $Mo(CO)_6$ antibonding molecular-orbitals to photoelectrons, and thereby 'promote' reaction. For adsorbate ($Mo(CO)_6$) adjacent to K this will increase the yield of photoproduct and lower the energy of radiation required to bring about adsorbate photodissociation and reaction, as observed.

Using the procedure for molecular-scale imprinting described in this patent, and imprinting Cl atoms which are electronegative, the inventors have seen the opposite effect, namely localised 'inhibition' of reaction. The effect, as viewed by us using atomic-resolution STM, is to decrease the yield of Cl atoms from chlorobenzene adsorbate that is closely adjacent to a previously formed Cl—Si bond at the surface. The inhibition effect was observed to be particularly marked for irradiation with photon-energies close to the threshold for photoinduced reaction, i.e., the difference in photoproduct yield close to and far from the chemical imprint was maximised.

When 'molecular-scale imprinting', the subject of this patent, is used to deposit metal or other electropositive atoms at local sites, the effect of the first metallic imprint in promoting reaction preferentially adjacent to the imprint will assist in the aggregation of photodeposited atoms or other photoproducts into nanoscale clusters or 'dots'. If, on the other hand, the initial imprint is electronegative, the inhibition of further irradiation-induced imprinting adjacent to the first chemical mark will, as we have observed, limit spreading of the mark and consequent 'blurring' of the imprint, making possible the closer-packing of nano-features. In both cases, promotion and inhibition, it is advantageous, to obtain the greatest differential effect, to use irradiation of the minimum energy required to initiate reaction.

It will be recognized that localised alteration of the surface energy-states due to chemical marking, etching or doping is equivalent to the creation of a 'quantum well' at the surface (which draws in surface electrons) or 'quantum barrier' (that repels them). Such a well or barrier can act as a scattering center for electrons propagating across the surface. This is the basis for the use of 'quantum corrals' by Eigler and co-workers (see ref. 21) to create interference patterns between reflected electron matter-waves, the system under study by Eigler being varied patterns (for example circles) of Fe atoms, deposited one atom at a time, and bound to the surface of Cu(111) at 4 K. Since then it has been shown that such 'corrals' can be formed chemically in large numbers by the reaction of $N_2^+$ with Cu(111), and can be used to trap electron-waves even at room temperature (see ref. 22).

The cited chemical process though it has the advantage of "mass production" has the limitation that it forms an uncontrolled mixture of shapes of quantum corrals (trapezoids, triangles and parallelograms, of varying size) each with different quantization. The process of molecular-scale marking described in this patent can, by contrast, imprint corrals of particular size and shape, depending on the adsorbate 'ink' chosen. Surface electrons propagating along a wire or thin layer of metal or semiconductor will exhibit quantum behavior if their matter-waves pass by such a pattern of quantum wells or barriers. Diffraction will transmit electrons of some energies and block electrons of other energies, therefore switching current on and off with changing applied voltage. The diffraction can be caused by any pattern capable of creating standing matter-waves (termed a 'quantum confinement'), of which an array of closed quantum corrals represents one example.

The effect of patterns of quantised energy wells or energy barriers on electrical conductance is known to those skilled in the art; depending on the energy-level spacing and level-occupancy in the quantum confined region, conduction electrons of critical energy are transmitted (for energies at 'resonance') or reflected (at 'antiresonance') in passing through that region, see ref. 23 and 24. Moreover, since level-occupancy is a factor, the conductance can be altered by light, for example by exciting electrons in the quantum confinement to the lowest unoccupied molecular orbital (the LUMO) which empty state would otherwise be fully available for conduction. The ability, through molecular scale imprinting as disclosed herein, to mass produce selected patterns of quantum wells or barriers, i.e. quantum confinements, on metals and semiconductors permits the useful tailoring of conductance to achieve specific switching characteristics in current-carrying wires and ribbons.

The semiconductor or metal film or wire must be thin enough so that the ratio of electrons diffracted to those not diffracted by the quantum confinements on the surface is sufficient to produce a detectable change in the conductivity as a function of electron energy. For nanometer scale dimension wires or films substantially all the electrons in the wire or film passing the quantum confinements will feel the effects. Nanometer scale means of molecular scale dimensions, i.e. tens of Angstroms in diameter. In wires or films with dimensions greater than nanometer scale as defined above, the electrons in the bulk feel little or no effect of the quantum confinements while the "surface electrons" (those in close proximity to the surface) will be diffracted. Thus in the nanometer scale wires or films most or all of the electrons will be "surface electrons".

The three processes to which this method of molecular-scale imprinting can be applied—writing, doping and etching—are all currently employed in a broad range of devices that fall under the generic name of microcircuitry. The method of patterned imprinting disclosed here opens the way to miniaturisation of these devices into the nanometer regime, an as yet unrealized goal of microelectronics. Other methods seeking to provide nanometer-scale pattern formation to date have not exploited the principles of the present method.

For example, the method disclosed in U.S. Pat. No. 5,129,991 to Gilton differs in several important respects from the method disclosed herein: (i) the adsorbed gas is not required to form a pattern but is uniformly distributed in Gilton, (ii) the pattern of etching is due to the presence of macroscopic "regions" in the substrate, with differing photoemission thresholds; and (iii) the "localised" nature of the radiation-induced reaction is a localisation to reaction with large-scale regions of the substrate rather than molecular-scale regions.

The present invention also differs from Yan et al., in several important respects. For example, in the method disclosed herein the pattern imprinted at the surface or a closely-related pattern is pre-existent in an adsorbed layer, and the process of imprinting in the present method is triggered by irradiation. Yan et al. did not disclose a layer of adsorbate, under the conditions of their experiment, nor a patterned layer, nor did they irradiate the surface of the substrate.

Over the past twenty years a new field of study termed DIET (Desorption Induced by Electronic Transitions) has emerged. It has been well established that electronic excitation of a molecule adsorbed on a surface temporarily alters the forces binding that molecule to the underlying surface. When, therefore, the molecule reverts to its normal 'ground' electronic state the change in binding in many cases desorbs the molecule. This effect is particularly marked for adsorbates containing $\pi$ bonds, which molecules are, therefore, especially prone to be dislodged from the surface [Ref. 25]. This class of molecule is the class required and employed for molecular wires and molecular-scale devices (nanodevices) fabricated from conducting polymers which are, chemically, conjugated diene chains or aromatic chains.

It will clearly be important to attach these chains at intervals to the underlying substrate. Using the example prominent in the observations and illustrations of the patented process, the chains of molecules could be synthesized with Cl substituents at intervals along their length. When irradiated with light, low-energy electrons, etc., energy would be transmitted through the $\pi$ bonds of the chains (in times of < or ~1 fs, before the chain could desorb) to the C—Cl bonds, rupturing some or all such bonds to chlorinate an adjacent site, as described in this patent. The dangling bond C—, left after C—Cl rupture at the long-chain molecular wire or device, will attach on a similar time-scale to an adjacent atom at the surface forming a strong chemical bond (C—Si, if the chain is a carbon chain and the substrate is Si). This photo-attachment, which in the same act of irradiation can be caused to repeat at numerous intervals along the molecular chain, will prevent the chain, i.e., the nanowire or nanodevice, from being dislodged by the repeated perturbation in its binding energy to the surface, occasioned by the successive passage of electrons through the wire or device.

It is recognized that in order to prevent unwanted flow of charge to or from the molecular wire through its points of attachment to the surface it may be advantageous (in terms of the example cited) to place the C—Cl bond, which following irradiation will become a C—Si bond to the substrate, in a side-chain off the conjugated chain.

Those skilled in the art will appreciate that photoimprinting and related types of radiation-induced imprinting which form the subject matter of this patent application are well-adapted for use in the ohmic, i.e., conductive, attachment of nanowires and nanodevices to surfaces. In the extensive literature relating to these devices, and proposals for them, it is envisaged that the attachment to the conducting electrodes, whether metallic or semiconductor, will be achieved through thermal reaction. The favoured thermal reaction is that between a thiol (—SH) group on the nanowire or device (D) and the metallic electrode (usually gold, Au) [Refs. 26, 27]. The thermal reaction in the example cited involves the spontaneous rupture of the S—H bond, with formation of an S—Au bond. The current flow is to or from the conjugated diene chain or aromatic chain in D, across the S atom at the D-S—Au contact.

It is recognized that the electronegative S atom, interposed between the device D and the electrode Au, has the effect of introducing a barrier to the flow of charge (a Schottky barrier). The method of this patent provides a means to the diminution or elimination of this barrier by directly attaching D to the electrode, e.g., forming a D-Au chemical bond.

The procedure can once again be exemplified by the radiation-induced breaking of a D-Cl bond, or bonds. In this instance the D-Cl bond should be situated in the molecular device at the point or points where ohmic contacts to an electrode material are desired. The D-Cl will adhere to the electrode such as Au, as D-Cl..Au, where the dots represent physisorption forces. Upon irradiation, e.g., with light or low-energy electrons, the $\pi$ bonds in D will absorb energy which will be transmitted to the D-Cl bond which can break (as in experiments on Ph-Cl reported here, with Ph being a phenyl group) leaving a dangling bond D- that can attach to the nearby Au to yield the desired direct D-Au attachment. The Cl can react with an adjacent Au atom to chlorinate it. Where light is the radiation used, this procedure may be termed molecular photosoldering.

The electrodes may be deposited onto the substrate as an array of spaced electrodes with very small dimensions, for example of micron dimensions or less. The substrate typically would be less conductive than the electrodes, so it may be an insulator or a low or lightly doped semiconductor. The electrodes may be metallic such as gold above or they may be semiconductor materials.

Very small amounts of impurities, termed dopants, are commonly introduced in parts per billion (ppb) quantities into semiconductors so as to control the number of charge carriers. If the dopants withdraw electrons, e.g., Al in Si, they are called p-type; if they add electrons, e.g., P in Si, they are n-type. In either case they are, in traditional practice, added randomly by such processes as vapour deposition [Ref. 28].

Where devices of molecular dimensions are to be doped the random deposition is likely to result in irreproducibility, since on this scale the deposition density can show significant statistical fluctuations.

The method of molecular-scale imprinting at the surface, which forms the subject of this patent, may be used to space out dopant molecules so as to avoid 'gaps' and 'pile-ups'. Thus aluminium (for p-type dosing of Si) or arsenic (for n-type) could be adsorbed as $AlR_3$ or $AsR_3$, using the organic group R to space the Al or As at regular intervals. An example of R is Ph.CO.OH, i.e. phenyl group with an acidic CO.OH substituted in the ring at the opposite end to the Al or As. The acid groups link the $Al(R.CO.OH)_3$, or the corresponding As compound, by hydrogen bonding to an acidic group in a neighbouring $Al(R.CO.OH)_3$ to form a two-dimensional network with Al or As at approximately regular intervals. Irradiation is used to effect the localised reaction of the Al or As. Photochemistry and electron-impact chemistry is commonly used in CVD (Chemical Vapour Deposition) to release M (e.g., M=Al or As) from gaseous $MR_3$, breaking the M-C bonds that attach M to R. In the present instance the irradiation-induced release of M from what is termed its 'encapsulated' condition, occurs in the adsorbed state so that the M . . . M separation is retained.

The foregoing description of the preferred embodiments of the process for marking or imprinting patterns onto surfaces has been presented to illustrate the principles of the invention and not to limit the invention to the particular embodiment illustrated. It is intended that the scope of the invention be defined by all of the embodiments encompassed within the following claims and their equivalents.

References

1. V. M. Hallmark et al., Phys. Rev. Lett. 70, 3740 (1993).
2. R. A. Wolkow et al., J. Chem. Phys. 103, 10696 (1995).
3. "The Adsorption of $C_6H_5Cl$ on Si(111)7×7 Studied by STM", X. H. Chen et al., Surf. Sci. 340, 224 (1995).
4. "Functional Group Identification in Scanning Tunneling Microscopy of Molecular Adsorbates", Donna M. Cyr et al., J. Phys. Chem, 100, 13747 (1996).
5. "Structure of Adsorbates on Alkali Halides (Theory). I. HBr on LiF (001)", J. C. Polanyi et al., J. Chem. Phys. 94, 978 (1991).
6. "Dynamics of Surface Aligned Photochemistry (Theory)". II, Localised H-atom Scattering in the HBr(ad) LiF(001)+hv System", V. J. Barclay et al., J. Chem. Phys. 97, 9458 (1992).
7. "Dynamics of Adsorbate Photochemistry", J. C. Polanyi et al., in Laser Spectroscopy and Photochemistry on Metal Surfaces, Advanced Series in Physical Chemistry—Vol. 5 eds. H -L. Dai and W. Ho (World Scientific Publishing Co. Ltd., Singapore, 1995), Chapter 26, p. 1241.
8. "Chemistry In Two Dimensions: Surfaces", G. Somorjai, Cornell U. Press, 1981; Chapter 5, p. 19.
9. "Manipulation of Matter At The Atomic And Molecular Levels", P. Avouris, Acc. Chem. Res. 28, 95 (1995).
10. "Photochemistry of Adsorbed Molecules. XI. Charge-Transfer Photodissociation and Photoreaction in Chloromethanes on Ag(111)", St. J. Dixon-Warren et al., J. Chem. Phys. 98, 5983 (1993).
11. "Photochemistry of Adsorbed Molecules. XII. Photoinduced Ion-Molecule Reactions at a Metal Surface For $CH_3X/RCl/Ag(111)$ (X=Br; I)", St. J. Dixon-Warren et al., J. Chem. Phys. 98, 5954 (1993).
12. "Photochemistry of Adsorbed Molecules. V. Ultraviolet Photodissociation of OPS on LiF(001)", K. Leggett et al., J. Chem. Phys., 93, 3645 (1990).
13. L. Sanche and L. Parenteau, Phys. Rev. Lett. 59, 136 (1987).
14. "Electron-Driven Dynamics at the Gas-Solid Interface—Dissociation, Desorption and Reaction of Adsorbed Molecules", R. J. Guest et al., Faraday Discuss. 96, 117 (1993).

15. "Photoetching of Si(111)7×7 Studied by STM", X. Y. Chen et al., Surf. Sci. 376, 77 (1997).
16. "Spatially Confined Chemistry: Fabrication of Ge Quantum Dot Arrays", J. R. Heath et al., J. Chem. Phys. 100 3144 (1996).
17. "Dynamics of Surface-Aligned Photochemistry (Theory), II. Localised H-Atom Scattering in the Hbr (001)/LiF(001)+hv System", V. J. Barclay et al., J. Chem. Phys. 97, 9458 (1992).
18. "Photochemistry of Adsorbed Molecules. XN, Localised Atomic Scattering in the Photolysis of HI/LiF(001) and HINaF(001)", V. J. Barclay et al., J. Chem. Phys. 105, 5005 (1996).
19. "Laser Spectroscopy and Photochemistry on Metal Surfaces", Advanced Series on Physical Chemistry-Vol. 5, eds. H-L Dai and W. Ho, Part II (Pub. World Scientific, 1995), Part IV, Chapters 24–27, p. 1045–1335.
20. "Photodissociation of Adsorbed $Mo(CO)_6$ Induced by Direct Photoexcitation and Hot Electron Attachment. I. Surface Chemistry", Z. C. Ying, and W. Ho, J. Chem. Phys. 93, 9077 (1990); "Photodissociation of Adsorbed $Mo(CO)_6$ Induced by Direct Photoexcitation and Hot Electron Attachment. II. Physical Mechanisms", Z. C. Ying and W. Ho, J. Chem. Phys. 94, 5701 (1991).
21. "Imaging Standing Waves in a Two-Dimensional Electron Gas", M. F. Crommie, C. P. Lutz and D. M. Eigler, Nature 363, 524 (1993); "Confinement of Electrons to Quantum Corrals on a Metal Surface", Science 262, 218 (1993).
22. "Room Temperature Quantum Corrals", S. L. Silva and F. M. Leibsle, Surf. Sci. 441, 904 (1999).
23. "Molecular Wires: Extended Coupling and Disorder Effects", M. Kemp, A. Roitberg, V. Mujica, T. Wanta and M. A. Ratner, J. Phys. Chem. 100, 8349 (1996).
24. "State Orthogonalization by Building a Hilbert Space: A New Approach to Electronic Quantum Transport in Molecular Wires", E. Emberly and G. Kirczenow, Phys. Rev. Letts. 81, 5205 (1998); "Electrical Conductance of Molecular Wires", E. Emberly and G. Kirczenow, Nanotechnology 10, 285 (1999).
25. S. N. Patitsas, G. P. Lopinski, O. Hul'ko, D. J. Moffat and R. A. Wolkow, 'Current-induced organic molecule-silicon bond breaking: consequences for molecular devices', Surface Science, 457, 425–431 (2000).
26. M. A. Reed, C. Zhou, C. J. Muller, T. P. Burgin, J. M. Tour, 'Conductance of a Molecular Junction', Science 278, 252–254 (1997).
27. Paul E. Laibinis, James J. Hickman, Mark S. Wrighton, George M. Whitesides, 'Orthogonal Self-Assembled Monolayers: Alkanethiols on Gold and Alkane Carboxylic Acids on Alumina', Science 245, 845–847 (1989).
28. A. Mak, S. R. Johnson, C. Lavoie, J. Mackenzie, M. K. Nissen, D. Rogers and T. Tiedje, 'Carbon filament source for p-type doping in molecular beam epitaxy', J. Vac. Sci. Technol. B 12(3), 1407 (1994).

What is claimed is:

1. A method of patterning a surface of a solid on a molecular scale, comprising:

providing a reactive solid having a surface;

forming a pattern of adsorbed molecules at sites on said surface of said reactive solid by providing a plurality of preselected molecules and exposing said surface to said preselected molecules; and forming an imprinted pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface, wherein said pattern of adsorbed molecules include elongated chains along which electrical charge can flow, including selected functional groups chemically bound to selected constituents in said elongated chains at intervals therealong, and wherein when said pattern of adsorbed molecules is irradiated said chemical bond between said selected functional groups and said constituent is broken, and wherein said selected constituent forms a chemical bond with said surface of said substrate at said intervals to anchor the imprinted elongated chains to said surface.

2. The method according to claim 1 wherein said elongated chains include conjugated diene or aromatic chains, and wherein said selected constituents are side chains spaced along said elongated chains.

3. The method according to claim 1 wherein said selected functional group is chlorine.

4. The method according to claim 1 wherein the imprinted elongated chains along which electrical charge can flow are nanoscale wires.

5. The method according to claim 1 wherein said preselected molecules include a functional group having at least one constituent capable of interaction with a constituent in a functional group in a neighboring preselected molecule adsorbed on said surface wherein said adsorbed molecules form a two dimensional network on said surface in which said dopant atoms are substantially regularly spaced.

6. The method according to claim 5 wherein said interaction is hydrogen bonding.

7. A method of patterning a surface of a solid on a molecular scale, comprising:

providing a reactive solid having a surface;

forming a pattern of adsorbed molecules at sites on said surface of said reactive solid by providing a plurality of preselected molecules and exposing said surface to said preselected molecules;

exposing said surface to an effective blocking agent subsequent to exposing said surface to said preselected molecules to militate against surface diffusion of said adsorbed molecules; and forming an imprinted pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface, wherein said blocking agent does not imprint on said surface under irradiation, wherein said pattern of adsorbed molecules include elongated conjugated chains along which electrical current can flow, including selected functional groups chemically bound to a selected constituent in said conjugated chains at intervals therealong, and wherein when said pattern of adsorbed molecules is irradiated said chemical bond between said functional group and said constituent is broken, and wherein a dangling bond from said selected constituent chemically binds to an atom in said surface of said substrate to anchor said elongated conjugated chains to said surface at said intervals along said conjugated chains.

8. The method according to claim 7 wherein said elongated conjugated chains include conjugated diene or aromatic chains.

9. The method according to claim 7 wherein said selected constituents are side chains spaced along said elongated conjugated chains.

10. A method of patterning a surface of a solid on a molecular scale, comprising:

providing a reactive solid having a surface;

forming a pattern of adsorbed molecules at sites on said surface of said reactive solid by providing a plurality of preselected molecules and exposing said surface to said preselected molecules; and forming an imprinted pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface, wherein said preselected molecules include at least one dopant atom which is either a p-type or an n-type dopant atom, and wherein said at least one constituent of the adsorbed molecule is said dopant atom, and wherein said imprinted pattern is a nanoscale wire.

11. The method according to claim 10 wherein said preselected molecules include a functional group having at least one constituent capable of interaction with a constituent in a functional group in a neighboring preselected molecule adsorbed on said surface wherein said adsorbed molecules form a two dimensional network on said surface in which said dopant atoms are substantially regularly spaced.

12. The method according to claim 10 wherein said substrate is a semiconductor and said dopant atoms are aluminum atoms.

13. The method according to claim 10 wherein said substrate is a semiconductor and said dopant atoms are arsenic atoms.

14. The method according to claim 11 wherein said interaction is hydrogen bonding.

15. A method of patterning a surface of a solid on a molecular scale, comprising:

providing a reactive solid having a surface;

forming a pattern of adsorbed molecules at sites on said surface of said reactive solid by providing a plurality of preselected molecules and exposing said surface to said preselected molecules;

exposing said surface to an effective blocking agent subsequent to exposing said surface to said preselected molecules to militate against surface diffusion of said adsorbed molecules; and forming an imprinted pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface, wherein said blocking agent does not imprint on said surface under irradiation, wherein said preselected molecules include at least one dopant atom which is either a p-type or an n-type dopant atom, and wherein said at least one constituent of the adsorbed molecule is said dopant atom.

16. A method of patterning a surface of a solid on a molecular scale, comprising:

providing a reactive solid having a surface with spaced electrically conducting electrodes formed on said surface;

forming a pattern of adsorbed molecules at sites on said surface of said reactive solid by providing a plurality of preselected molecules and exposing said surface to said preselected molecules; and forming an imprinted pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface, wherein said pattern of adsorbed molecules comprise elongated conjugated chains along which electrical charge can flow, wherein each elongated chain includes a selected functional group chemically bound to a selected constituent in said elongated chains, and wherein when said pattern of adsorbed molecules is irradiated said chemical bond between said selected functional group and said selected constituent is broken whereafter said selected constituent forms a chemical bond with an electrically conducting electrode on said surface, and wherein the electrical contact between the electrically conducting electrode and the elongated chain chemically bound thereto is an ohmic electrical contact.

17. A method of patterning a surface of a solid on a molecular scale, comprising:

providing a reactive solid having a surface;

forming a pattern of adsorbed molecules at sites on said surface of said reactive solid by providing a plurality of preselected molecules and exposing said surface to said preselected molecules;

exposing said surface to an effective blocking agent subsequent to exposing said surface to said preselected molecules to militate against surface diffusion of said adsorbed molecules; and forming an imprinted pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface, wherein said blocking agent does not imprint on said surface under irradiation, and including spaced electrically conducting electrodes formed on said surface, wherein said pattern of adsorbed molecules comprise elongated conjugated diene or aromatic chains along which electrical charge can flow, wherein each elongated chain includes a selected functional group chemically bound to a selected constituent in said elongated chains, and wherein when said pattern of adsorbed molecules is irradiated said chemical bond between said selected functional group and said selected constituent is broken whereafter said selected constituent forms a chemical bond with an electrically conducting electrode on said surface, and wherein the electrical contact between the electrically conducting electrode and the elongated chain chemically bound thereto is an ohmic electrical contact.

18. The method according to claim 17 wherein said electrically conducting electrodes are metallic or semiconductor.

* * * * *